United States Patent
Pagano et al.

(10) Patent No.: US 8,441,341 B2
(45) Date of Patent: May 14, 2013

(54) SYSTEM, APPARATUS, AND METHOD FOR PCB-BASED AUTOMATION TRACEABILITY

(75) Inventors: Chuck Pagano, Foxboro, MA (US); Richard Keenan, Whitinsville, MA (US)

(73) Assignee: NXP B.V., Eindhoven (NL)

( * ) Notice: Subject to any disclaimer, the term of this patent is extended or adjusted under 35 U.S.C. 154(b) by 413 days.

(21) Appl. No.: 12/513,913

(22) PCT Filed: Nov. 7, 2007

(86) PCT No.: PCT/US2007/083930
§ 371 (c)(1),
(2), (4) Date: May 11, 2009

(87) PCT Pub. No.: WO2009/061316
PCT Pub. Date: May 14, 2009

(65) Prior Publication Data
US 2010/0219941 A1    Sep. 2, 2010

Related U.S. Application Data

(60) Provisional application No. 60/857,748, filed on Nov. 7, 2006.

(51) Int. Cl.
*H04Q 5/22* (2006.01)
(52) U.S. Cl.
USPC ........................................ 340/10.4; 340/572.7
(58) Field of Classification Search ............... 340/10.1, 340/10.2, 10.3, 10.31, 10.4, 10.41, 10.5, 340/572.1, 572.7; 343/846
See application file for complete search history.

(56) References Cited

U.S. PATENT DOCUMENTS

| | | | |
|---|---|---|---|
| 6,249,227 B1 * | 6/2001 | Brady et al. | 340/572.1 |
| 2002/0067266 A1 | 6/2002 | Lee et al. | |
| 2002/0125997 A1 | 9/2002 | Kashi et al. | |
| 2002/0190913 A1 * | 12/2002 | Kuck | 343/846 |
| 2008/0101050 A1 * | 5/2008 | Fung | 361/794 |

FOREIGN PATENT DOCUMENTS

| | | |
|---|---|---|
| DE | 100 39 997 A1 | 2/2002 |
| DE | 100 56 112 A1 | 5/2002 |
| WO | 02/096168 A | 11/2002 |

* cited by examiner

*Primary Examiner* — Nabil Syed

(57) ABSTRACT

A system, apparatus, and method are provided for using a PCB component as an antenna to allow for RFID communication in the UHF band. The present invention enables supply chain management of a PCB and products containing the PCB by enabling tracking of a PCB at the assembly level such that at each production stage of the board production it is known exactly where the product is and what is its present state of test. One embodiment uses an existing ground plane of a PCB, splitting the ground plane of all the layers of the PCB, allowing for a dipole structure that provides an adequate received energy level to power the circuit to the "on" state thereby allowing RFID/Electronic Product Code transactions. In alternative embodiments, existing or added traces are used in place of the split ground plane as an antenna for the RFID IC. The supply chain management can employ a dedicated RFID interrogator that is connected to an IT network and allows for bill of materials to be fulfilled in an automated fashion throughout the assembly of the PCB. The manufacturer of the end product can also use the RFID IC in an own end product item level supply management system that includes inventory, shipments, and returns.

28 Claims, 8 Drawing Sheets

100% Split Ground Plane Antenna

**100% Split Ground Plane
Antenna

Partially Split Ground Plane Antenna

Example of PCB Panel with Split Ground Antenna

Example of Flip Chip Surface-Mounted RFID IC

Example of PCB Pad Layout for Flip Chip Surface-Mounted RFID IC

Example of Operation of RFID IC Using Interrogator

Example of RFID in SMT Assembly

Fig. 7.1 Surface Mount Packaged RFID on PCB

Fig. 7.2 Example of empty cell Phone.

Fig. 7.3 RFID enabled PCB Mounted in cell phone.

Fig. 7.4 RF Shielding Material added for spacer between metal Display and PCB.

Fig. 7.5 Display added over shielding.

Fig. 7.6 RFID enabled PCB Mounted in cell phone.

Fig. 7.7 Cell Phone powered to on State with RFID enabled PCB inside.

Modified Phone PCB With Components

SYSTEM, APPARATUS, AND METHOD FOR PCB-BASED AUTOMATION TRACEABILITY

CLAIM OF PRIORITY

This application claims the benefit under 35 U.S.C. 119(a) of U.S. Provisional Application Ser. No. 60/857,748 entitled "CELL PHONE SPLIT GROUND PLANE RFID ANTENNA" filed in the United States Patent Office on Nov. 7, 2006, the entire contents of which are incorporated herein by reference.

BACKGROUND OF THE INVENTION

1. Field of the Invention

The present invention relates to a system, apparatus, and method for using a cell phone ground plane as an antenna for an RFID IC die mounted on the surface of a PCB or embedded within the layers of a PCB attached to the antenna to form an RFID transponder. More particularly, the present invention relates to using existing or added traces, in addition to the split ground plane, as an antenna for the RFID IC. Most particularly, RFID supply chain management of PCBs and end products containing PCBs is enhanced by the present invention through use of the PCB, modified to include a transponder according to the present invention, for assembly level automation traceability.

2. Description of the Related Art

The production and use of electronic printed circuit boards (PCB's), has grown in complexity and diversity requiring corresponding supply chain enhancements at the PCB assembly level to manage the production process. In addition, supply chain processes to which electronic tagging can be applied include logistics and tracking of the PCB. Cell phone manufacturers require traceability of PCB's at the assembly level such that a cell phone PCB production process requires identification and monitoring of a PCB at each stage of the board production in order to know exactly where the product is and its present state of test.

Supply chain tracking of PCB's is typically done using a barcode 2D system, which is line of sight. There are problems reading barcodes at different steps in an assembly process and bar codes can also become damaged or lost. For example, instantaneous high temperatures are required to solder components to a PCB and PCB cleaning processes require acids, solvents and alkalis, all of which can damage conventional adhesive labels to a point where they fall off or become illegible. An RFID IC is less likely to suffer under these circumstances and if mounted on the cell phone PCB as a first component, provides PCB location information at any stage/test. Thus, monitoring/recording PCB progress using an RFID IC can provide an audit trail of the production activities accomplished with respect to a cell phone PCB.

Prior art PCB RFIDs stipulate the use of a loop trace to communicate with the RFID device via the near field (Fresnel) phenomenon. This type of prior art PCB RFID take up additional costly area on the PCB.

SUMMARY OF THE INVENTION

The present invention utilizes already existing circuit traces or ground plane of a PCB. An embodiment of the present invention that uses the ground plane, splits the ground plane (making a dipole or folded dipole antenna) in a way that minimal ground plane needs to be removed therefore causing minimal impact to the operation of an end product containing the PCB, e.g., a cell phone, and takes advantage of the Fraunhafer zone, where communication is more efficient due to the electromagnetic as opposed to just magnetic fields.

That is, the present invention provides for the use of IC surface mount flip chip or embedding technology to include an RFID IC along with a dipole antenna within a PCB that, in the example of a split ground plane antenna does not take up any additional area within the PCB. The RFID IC and antenna can be tracked through all PCB assembly processes (tracking and recording SMT defects, Real-time SMT process control, repair and rework history), testing (rework during testing, test process control), final product assembly (mixed line assembly tracking, automated assembly management) and supply chain management (more accurate shipments, improved labor utilization, shorter lead times, reduce out-of-stock at retail, improved supply chain efficiencies, and prevent theft and counterfeiting).

A split ground plane of a PCB is only one embodiment for the antenna design of the present invention, other existing or added traces can be used in other embodiments in place of the split ground plane as an antenna along with an RFID IC.

The present invention also provides for improved supply chain management of PCB and products containing PCBs. A major cell phone manufacturer needs traceability of PCB's at the assembly level to automate the population of such, when similar products are being manufactured simultaneously on the same assembly line with slightly different options and BOM (bill of materials) to meet geographical market needs. Typically, a manufactured RFID IC is ultimately embedded within the layers of a PCB or flip chip mounted on the surface of the PCB that is attached to an antenna. One novel approach of the present invention is the use of an existing ground plane of the PCB. In an embodiment of the present invention, splitting the ground plane on all the layers of the PCB allows for a dipole antenna structure that provides an adequate energy level received to power the circuit to the on state thereby allowing RFID/Electronic Product Code transactions.

RFID supply chain management takes place using, for example, a dedicated RFID interrogator that is connected to an IT network such that a bill of materials can be fulfilled in an automated fashion throughout the assembly of a PCB. The manufacturer of the end product can also use the dedicated RFID interrogator in the manufacturer's item level supply management (e.g., inventory, shipments, and returns).

BRIEF DESCRIPTION OF THE DRAWINGS

The above and other features and advantages of the present invention will be more apparent from the following detailed description taken in conjunction with the accompanying drawings, in which.

DETAILED DESCRIPTION OF EMBODIMENTS

In the discussions which follow an assembly tracking process directed to a PCB is used as an example. Any end product requiring assembly process automation traceability and including a PCB according to the present invention can be tracked using the present invention.

The present invention provides a system, apparatus, and method that use IC embedding technology to embed an RFID IC along with a dipole antenna within a PCB that in the example of a split ground plane antenna does not take up any additional area within the PCB. This configuration allows for a dipole structure that provides an adequate energy level received to power an RFID IC 101 circuit to the 'on' state therefore allowing RFID IC 101/Electronic Product Code transactions. A die including the embedded RFID IC 101 has a low profile configuration which is essential in RFID labeling applications. A PCB or end product labeled with such an RFID IC 101, i.e., containing such an RFID IC 101, and including such an antenna to power the RFID IC 101 can be tracked through all assembly processes and may be used after the assembly process is complete in the end product for further tracking (e.g., servicing the PCB), authenticity verification, and supply chain management activities.

Figure 1A:
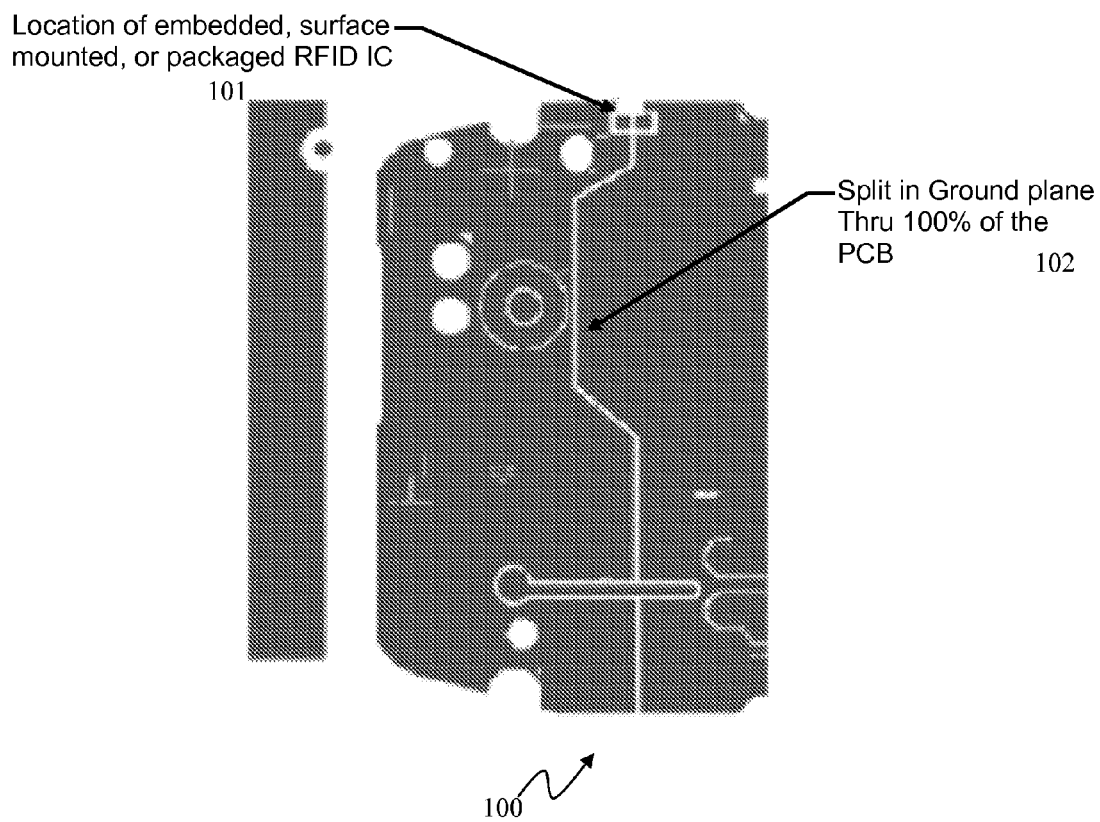
FIG. 1A is a view illustrating an embodiment of the present invention as a 100% ground plane split.
Figure 1B:
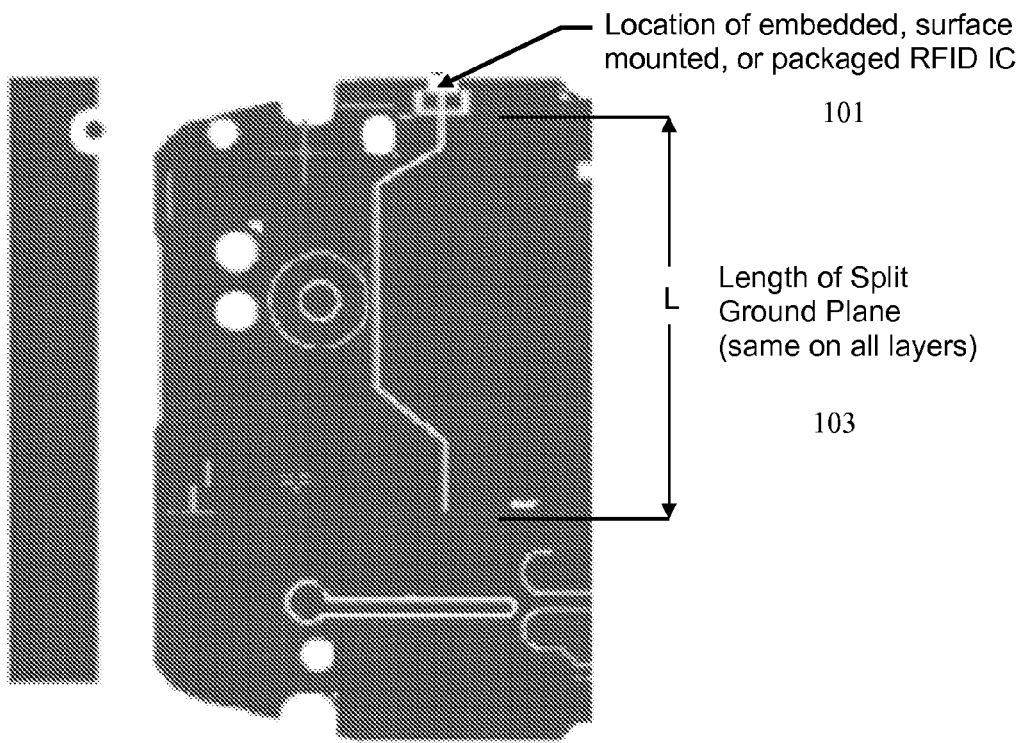
FIG. 1B is a view illustrating an embodiment of the present invention having a partially split ground plane with the length of L.

In a first embodiment of the present invention, see FIG. 1A, a PCB 100 comprising a split ground plane antenna 102 and an RFID IC die 101 that includes a unique ID for the PCB, is the first component embedded in the PCB 100 in order to manage the manufacturing process of the PCB 100. As illustrated in FIG. 1A, the ground plane can be 100% split 102, or as illustrated in FIG. 1B, partially split 103 to a predetermined length. The length and shape of the split is based on the particular grounding required by an end product and the matching between the RFID IC impedance and the split ground plane antenna impedance to maximize the power transfer to and from the RFID IC. This length and shape directly affects the performance of the RFID antenna. Alternatively, other existing or added traces are used in alternative embodiments in place of the split ground plane as an antenna that is added as a first component along with the RFID IC containing the unique ID for the PCB.

Figure 2:
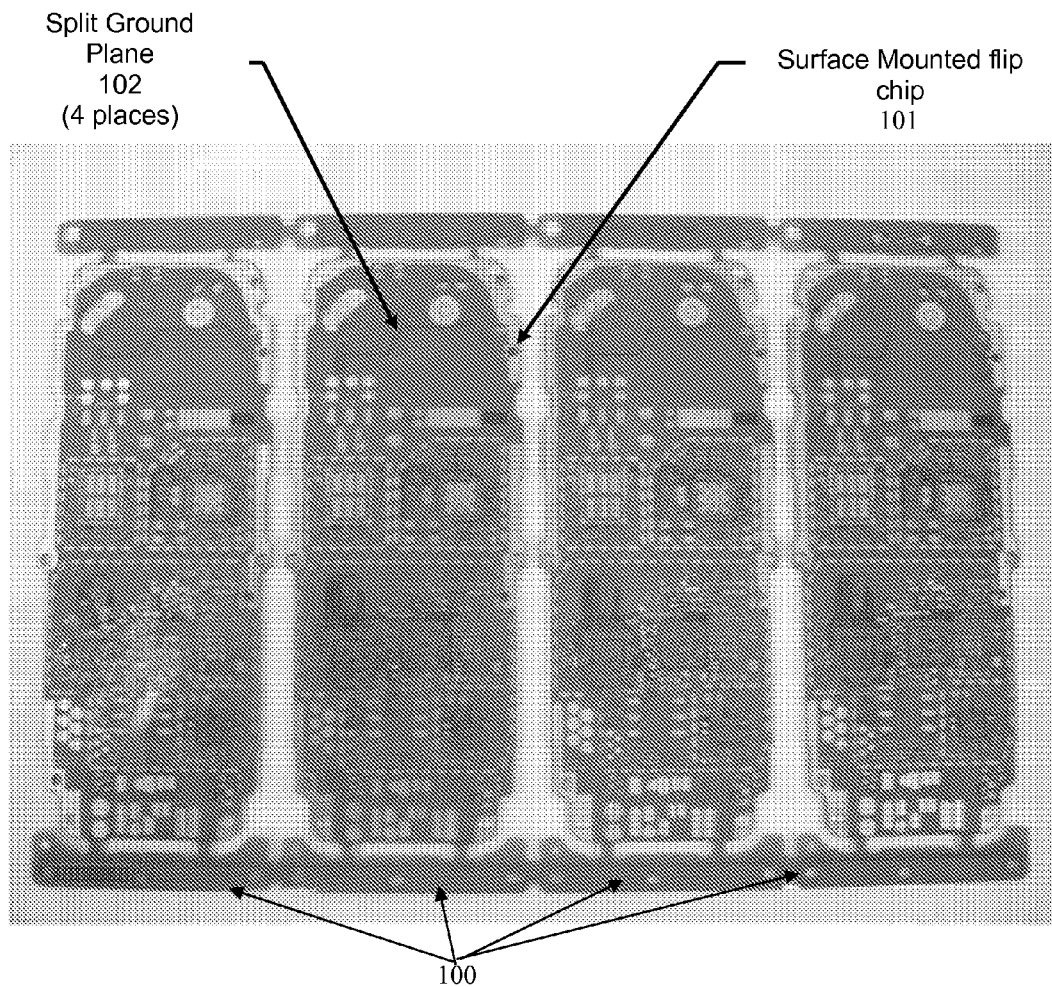
FIG. 2 illustrates a PCB panel with multiple individual PCB's each having its own split ground plane antenna connected to an RFID IC with a unique serial number.
Figure 3:
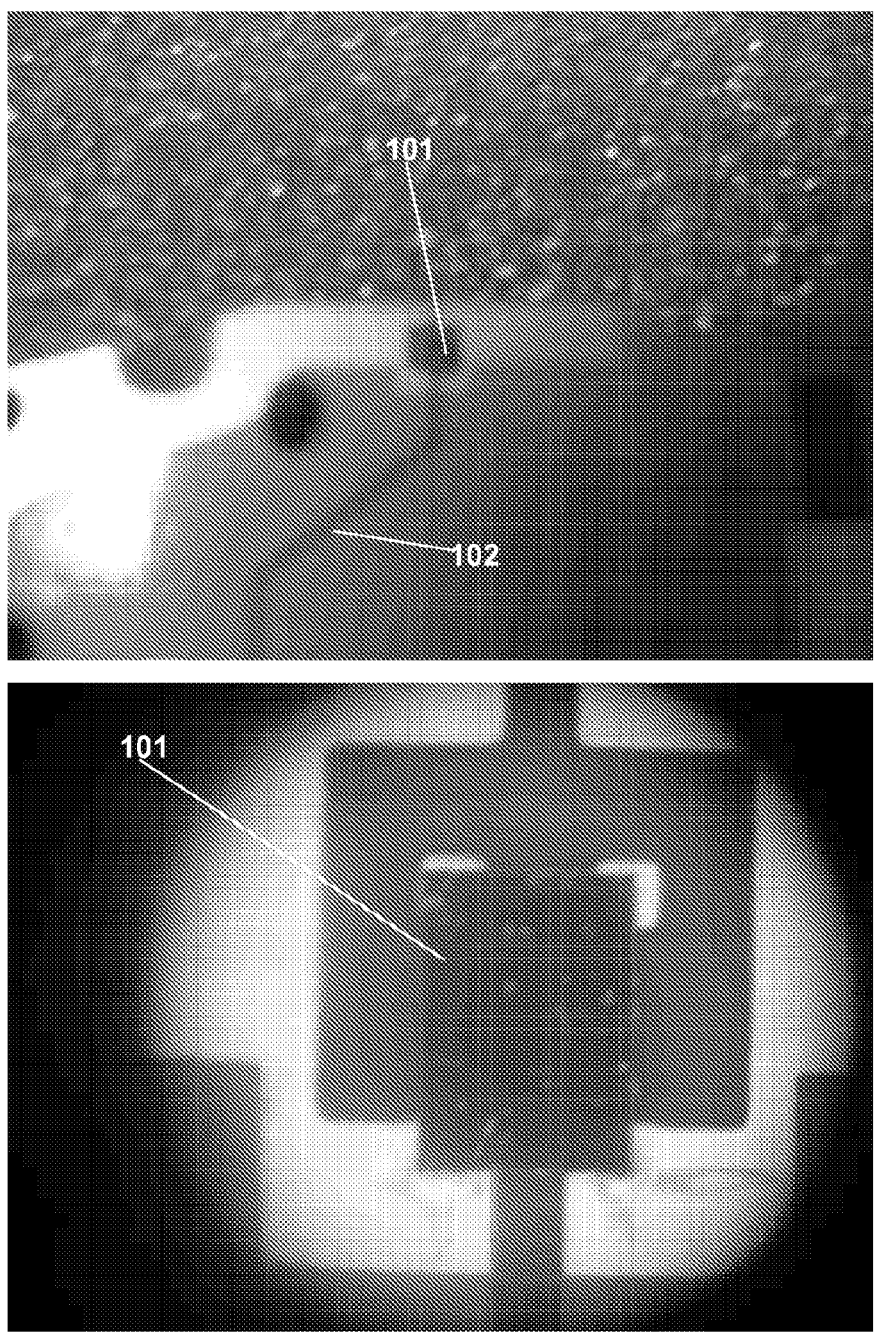
FIG. 3 illustrates and example of a RFID IC flip chip mounted on the surface of the PCB connected to the split ground plane antenna.

An example of an RFID enabled PCB panel that includes an RFID IC and split ground plane antenna on each individual PCB 100 within the panel is illustrated in FIG. 2. Each PCB 100 within the panel comprises a split ground plane antenna attached to the RFID IC 101 according to the present invention, as illustrated in FIG. 3, and has a unique serial number and additional memory that can be programmed with additional information for tracking and automation.

Figure 4:
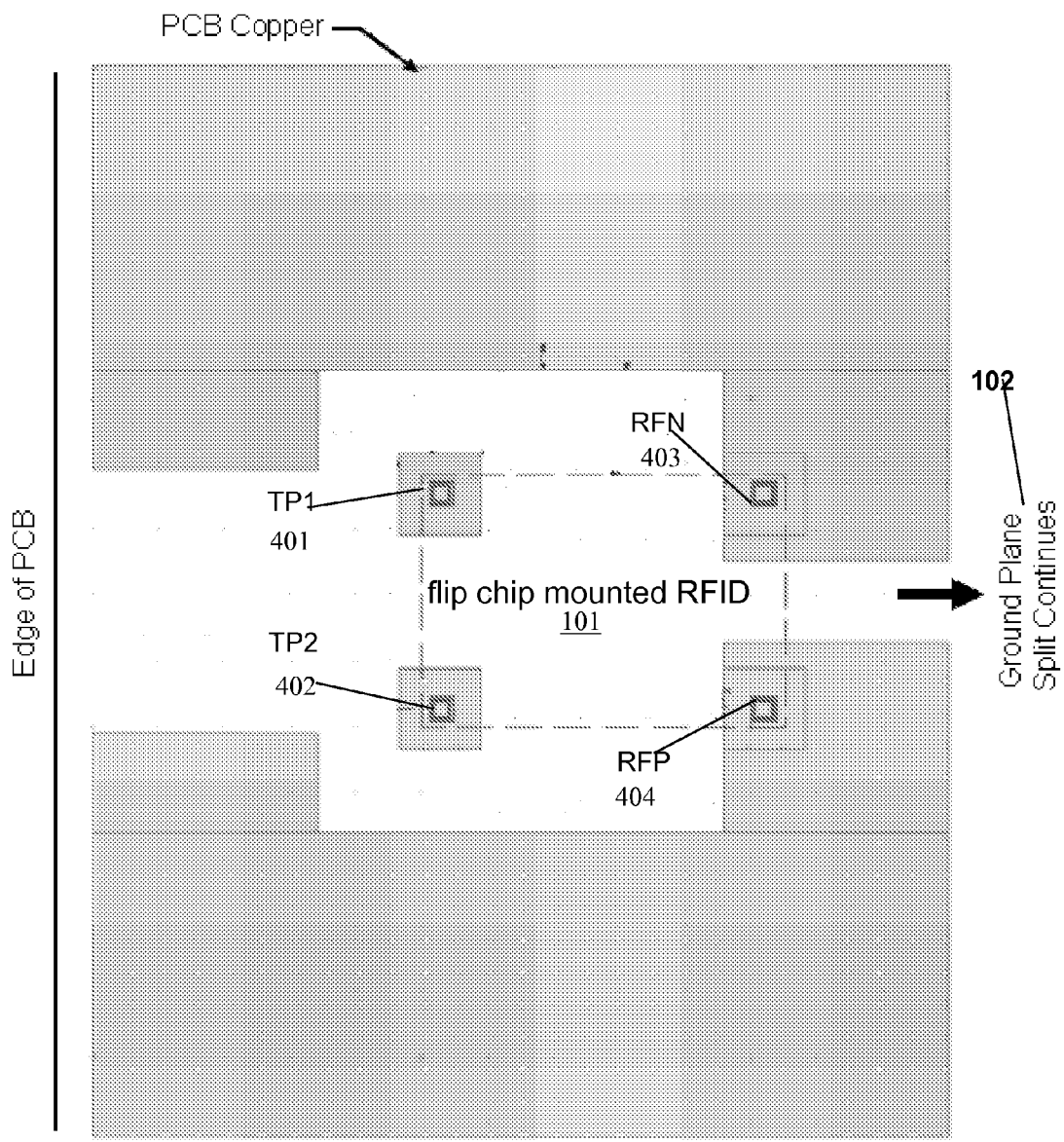
FIG. 4 is a view illustrating an example of a pad layout for an RFID IC die according to the present invention.

An example of a PCB pad layout for an RFID IC according to the present invention is illustrated in FIG. 4. As illustrated the PCB pad layout has four I/O pad connection points where an RFID IC 101 flip chip is attached at one end of the split ground plane antenna. The RFID IC four connection points are comprised of two test pads TP1 401 and TP2 402 which are used during wafer processing test and also used for mechanical attachment support to the PCB. RFN 403 and RFP 404 are the RF ports on the RFID IC 101 that are attached to each side of the dipole antenna or split ground plane on the PCB according to the present invention and where the energy sent from an interrogator to the split ground plane antenna is transferred to the RFID IC 101. The size of the pads and distance between pads is determined by the RFID IC 101 used and differs from manufacturer to manufacturer thereof.

Figure 5:
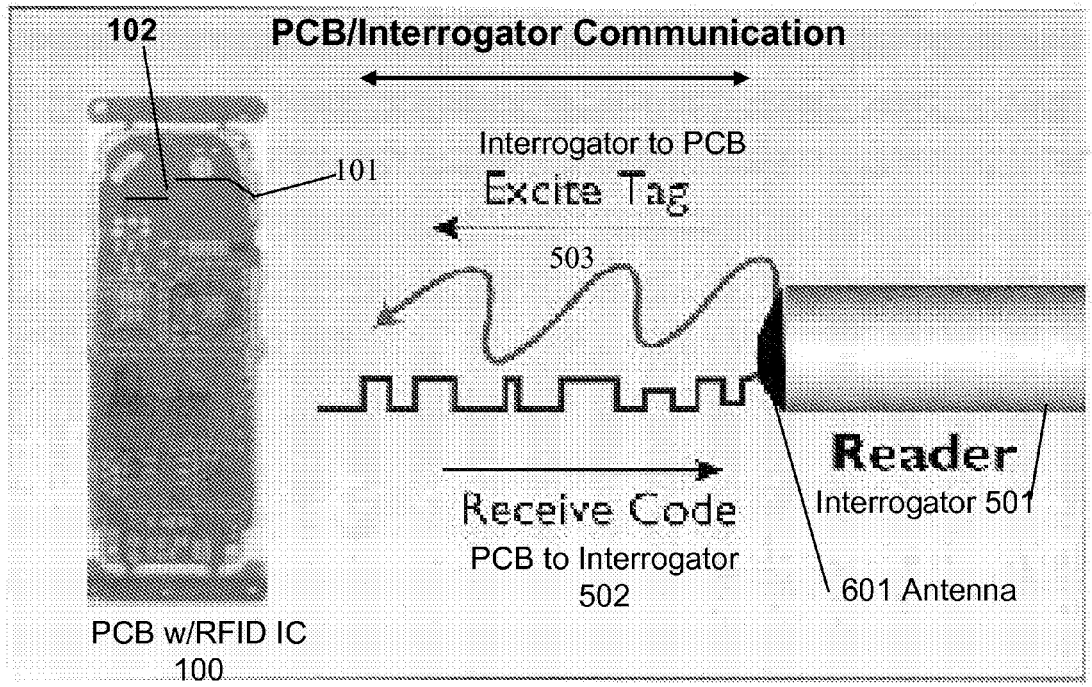
FIG. 5 is a view illustrating operation of an RFID IC using an interrogator, according to the present invention.
Figure 6:
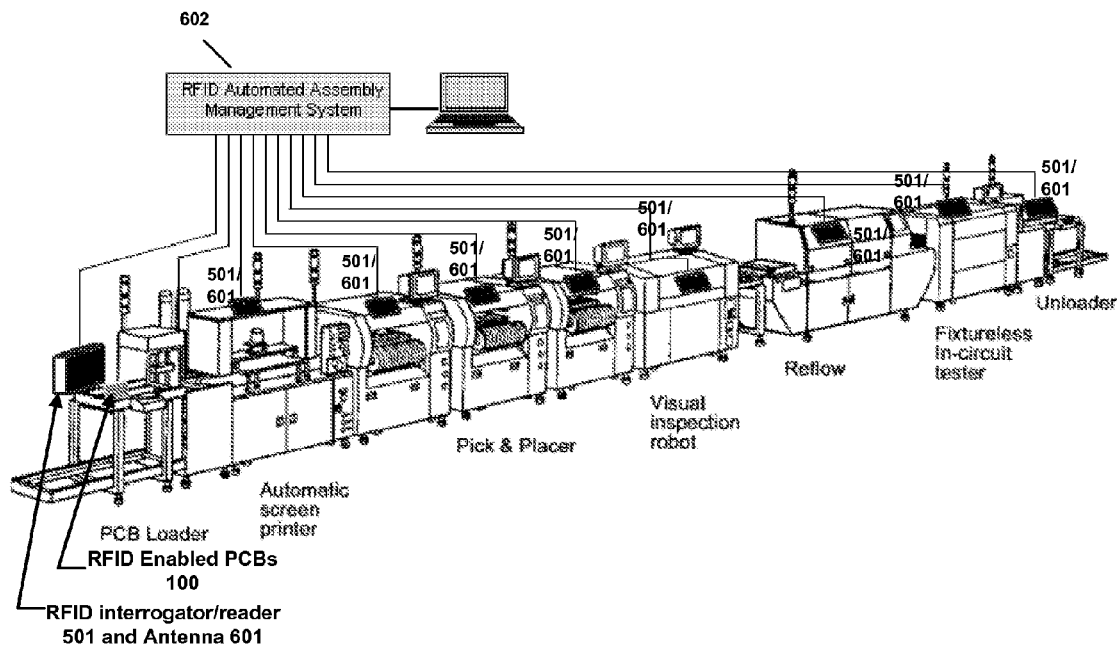
FIG. 6 is a view of a system for an assembly process for a product employing the use of an antenna and requiring automation traceability wherein an embedded RFID IC is attached to the antenna and is embedded in the first step of said process and the embedded RFID IC is interrogated by a dedicated interrogator for each step in the process using power supplied by the attached antenna.

In all embodiments of the present invention, the RFID supply chain management employs an RFID interrogator/reader 501 that is connected to an IT network and allows for bill of materials to be fulfilled, process control, tracking SMT defects, etc., in an automated fashion throughout the PCB SMT assembly process, which is illustrated in FIG. 6. The interrogator/reader 501 thru the antenna 601 sends a transaction request to the RFID IC 101 which then sends a response to the requested transaction, e.g., sends its ID 502 to the RFID antenna 601 and interrogator 501, as illustrated in FIG. 5. The manufacturer of the end product containing the PCB 100 can also use this RFID IC 101 and an own dedicated RFID interrogator/reader 501 and antenna 601 in the manufacturer's own item level supply management. (e.g., inventory, shipments, returns.)

Referring now to FIG. 6, there is an antenna 601 and reader/interrogator 501 at every station in the assembly process that can communicate with the PCB 100 at that stage in the process. Alternatively, there can also be a few interrogators 501 for the whole line that are each connected to multiple antennas. The Software/middleware system 602 developed for the specific assembly application control communicates with the interrogator(s) 501 to determine which interrogator and antenna is communicating with the PCB 100 and determine where the PCB 100 is in the SMT assembly process. Information is read from the RFID IC 101 enabled PCB 100 and also written to the additional memory of the RFID IC 101 on the PCB 100 at each stage in the process.

Figure 7:
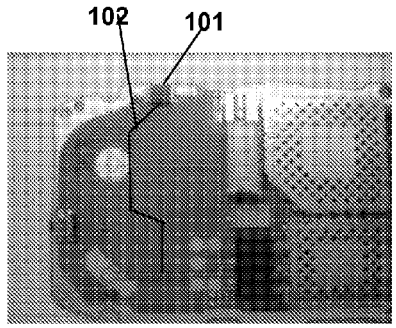
FIG. 7 is a view illustrating a cell phone comprising a PCB with an embedded RFID die, according to the present invention.
Figure 7:
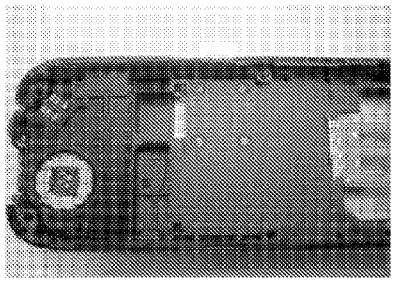
Figure 7:
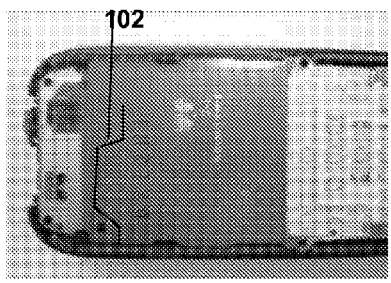
Figure 7:
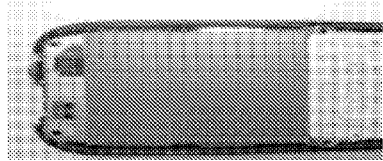
Figure 7:
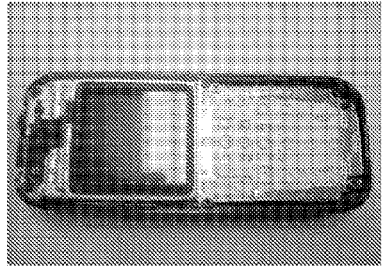
Figure 7:
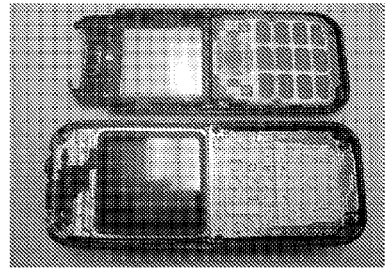
Figure 7:
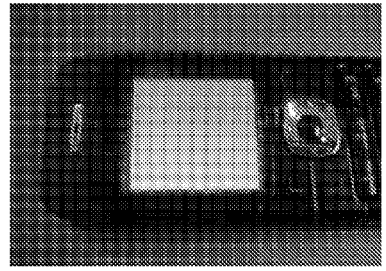

Referring now to FIG. 7, steps are shown to modify a cell phone to include a PCB 100 according to the present invention. FIG. 7.1 illustrates a surface mount packaged RFID IC die 101 on a PCB 100. FIG. 7.2 is an example of empty cell phone. FIG. 7.3 illustrates an RFID-enabled PCB 100 mounted in the cell phone having a split ground plane antenna 102, according to an embodiment of the present invention. The length and shape of the split determines the impedance characteristics and resonant frequency of the antenna. The better matched the antenna impedance is to RFID IC and optimized for the operating frequency the better the RFID performance. In the example shown in FIG. 1, the antenna in FIG. 1A is better matched to the RFID IC and has better RFID performance than the split ground plane antenna shown in FIG. 1B, however FIG. 1B is a better trade-off for RFID performance (a pre-set criterion) and the required ground plane continuity of the end product (a pre-set criterion). FIG. 7.4 illustrates RF shielding material added for spacer between a metal display of the cell phone and the PCB 100. FIG. 7.5 illustrates a display added over the shielding material. FIG. 7.6 illustrates an RFID-enabled PCB 100 mounted in the cell phone with the top cover of the RFID-enabled PCB 100 removed. FIG. 7.7 illustrates the cell phone with cover in place and powered to on.

Examples of embodiments of the present invention include
1. A first embodiment separates an already existing ground plane in the PCB 100 design as illustrated in FIG. 1A and FIG. 1B. The length and shape of the split is predetermined and based on the particular grounding required by an end product in which an RFID die 101, according to the present invention, is being embedded or attached. This length directly affects the performance of the RFID antenna. The RFID die 101 can be embedded within the PCB or attached by use of conventional "flip chip" techniques as illustrated in FIG. 2 and FIG. 3, to achieve an operational RFID transponder.
2. An alternative embodiment uses at least one existing signal line that will not result in performance degradation of the end product with an RFID IC 101 on the line.
3. A further alternative embodiment adds at least one trace on the PCB 100 that acts as an antenna to allow energy and requests to be transferred to the RFID IC 101 and responses thereto to be transmitted thereby.

The present invention is applicable to any PCB 100 employing the use of a ground plane or which includes usable signal lines (whose use does not degrade performance of the end product containing the PCB) or to which a suitable trace can be added, and requiring automation traceability. Any end product requiring automation traceability and containing such a PCB 100 can also be also be tracked using the present invention.

While the system, apparatus and method of the present invention has been shown and described with reference to certain example embodiments thereof, it will be understood by those skilled in the art that various changes in form and details may be made therein without departing from the spirit and scope of the invention as defined by the appended claims. Accordingly, the scope of the invention is not to be limited by the above embodiments to just tracking PCB production but by the claims and the equivalents thereof.

The invention claimed is:

1. A printed circuit board (PCB) apparatus, having multiple levels including an internal level, for inclusion in an end product as a tracking device, said PCB apparatus comprising:
   an RFID IC die having a unique ID for said PCB and having an RFID circuit to respond to tracking transaction requests; and
   an RFID split-ground-plane antenna operably connected to the RFID circuit, with a ground plane distributed on at least two levels of the PCB, and integrally formed from at least one component of said PCB, to receive and forward said tracking transaction requests to the RFID circuit and transmit responses therefrom such that the PCB acts as a tracking device of the end product including the PCB.

2. The PCB apparatus of claim 1, wherein the RFID IC die and RFID antenna are first components respectively added to and created from at least one component of the PCB such that a signal received by the RFID antenna powers on the RFID circuit to receive and respond to tracking transaction requests.

3. The PCB apparatus of claim 1, wherein the RFID IC die further comprises a local memory for storing and retrieving therefrom a plurality of tracking data including
   assembly stage and date,
   test type, result and date,
   unique PCB ID, and
   end product type.

4. The PCB apparatus of claim 3, wherein the RFID IC die and RFID antenna are first components respectively added to and created from at least one component of the PCB such that a signal received by the RFID antenna powers on the RFID circuit to receive and respond to tracking transaction requests.

5. The PCB apparatus of claim 4, wherein the RFID IC die is included in the PCB using a technique selected from the group consisting of embedding the RFID IC die in the PCB, attaching the RFID IC die to the PCB as an RFID IC flip chip using flip-chip technology such that in combination with the RFID antenna an RFID transponder is formed therefrom, and attaching a pre-packaged RFID IC die to the PCB.

6. The PCB apparatus of claim 5, further comprising the ground plane having a split through all levels thereof, such that the length and shape of the split is predetermined and based on a particular grounding requirement of the end product, wherein the RFID split-ground-plane antenna is formed from the split component of the PCB-that behaves as a dipole antenna and the length and shape of the split directly determines the performance in accordance with pre-set performance criteria.

7. The PCB apparatus of claim 5, wherein the RFID antenna comprises an antenna formed from at least one existing signal line component of the PCB operably connected to said RFID circuit to allow received energy and tracking requests to be transferred thereby to the RFID circuit and responses therefrom to the tracking requests to be transmitted thereby such that performance of the end product does not degrade when the RFID circuit is operational on the at least one signal line.

8. The PCB apparatus of claim 5, wherein the RFID antenna comprises an antenna formed from at least one added track to the PCB operably connected to said RFID circuit to allow received energy and tracking requests to be transferred thereby to the RFID circuit and responses therefrom to the tracking requests to be transmitted thereby.

9. The PCB apparatus of claim 6, further comprising a pad layout having four I/O pad connection points to which the RFID IC flip chip is attached at an end of the split ground plane antenna, said four connection points including two RF ports on the RFID circuit that are each attached to a side of the dipole antenna and where energy and tracking requests received by the antenna are transferred to the RFID circuit.

10. The PCB apparatus of claim 9, wherein a size of the I/O pad connection points and a distance between the I/O pad connection points is determined by the RFID circuit and varies according to a manufacturer thereof.

11. A system for tracking an assembly of an end product that includes a printed circuit board (PCB) having multiple levels including an internal level, comprising:
   a pre-determined sequence of at least one assembly station that assemble the end product such that a first assembly station of said sequence adds to the PCB an RFID transponder comprising (1) an RFID split-ground-plane antenna formed from at least one component of the PCB and (2) an RFID IC die that includes an RFID circuit and a unique identifier of the PCB, said antenna being operably connected to said RFID circuit with a ground plane distributed on at least two levels of the PCB; and
   at least one RFID transceiver associated with said sequence to send energy and tracking transaction requests to the RFID transponder to respectively power on the RFID circuit and send the tracking transaction requests, to the RFID circuit and receive responses to said tracking transaction requests transmitted thereby.

12. The system of claim 11, wherein the RFID IC die further comprises a local memory for storage and retrieval therefrom of a plurality of tracking data including:
   assembly stage and date,
   test type, result and date,
   unique PCB ID, and
   end product type.

13. The system of claim 11, wherein the RFID IC die is included in the PCB using a technique selected from the group consisting of embedding the RFID IC die in the PCB, attaching the RFID IC die to the PCB as an RFID IC flip chip using flip-chip technology, and attaching a pre-packaged RFID IC die to the PCB.

14. The system of claim 13, wherein the RFID IC die further comprises a local memory for storage and retrieval therefrom of a plurality of tracking data including:
  assembly stage and date,
  test type, result and date,
  unique PCB ID, and
  end product type.

15. The system of claim 14, wherein the PCB further comprises-the ground plane having a split through all layers thereof, such that the length and shape of the split is predetermined and based on a particular grounding requirement of the end product,
  wherein the RFID split-ground-plane antenna is formed from the split component of the PCB that behaves as a quasi dipole antenna and the length of the split directly determines the performance of the RFID antenna in accordance with pre-set performance criteria.

16. The system of claim 14, wherein the RFID antenna comprises an antenna formed from an existing signal line component of the PCB operably connected to said RFID circuit to allow received energy and tracking requests to be transferred thereby to said RFID circuit and responses therefrom to the tracking requests to be transmitted thereby such that performance of the end product does not degrade when the RFID circuit is operational on the signal line.

17. The system of claim 14, wherein the RFID antenna comprises an antenna formed from at least one added trace component to the PCB operably connected to said RFID circuit to allow received energy and tracking requests to be transferred thereby to the RFID circuit and responses therefrom to the tracking requests to be transmitted thereby.

18. The system of claim 15, wherein the PCB further comprises a pad layout having four I/O pad connection points to which the RFID IC flip chip is attached at an end of the split ground plane antenna, said four connection points including two RF ports on the RFID circuit that are each attached to a side of the dipole antenna and where energy and tracking requests received by the antenna are transferred to the RFID circuit.

19. The system of claim 18, wherein a size of the I/O pad connection points and a distance between the I/O pad connection points is determined by the RFID circuit and varies according to a manufacturer thereof.

20. A method for including a printed circuit board (PCB), having multiple levels including an internal level, in an end product as a tracking device, comprising the steps of:
  attaching to said PCB an RFID IC die having a unique ID for said PCB and an RFID circuit to respond to tracking transaction requests;
  integrally forming from at least one component of said PCB an RFID split-ground-plane antenna; and
  operably connecting the RFID antenna to the attached RFID circuit, with a ground plane distributed on at least two levels of the PCB to receive and forward said tracking transaction requests to said RFID circuit and transmit responses therefrom such that the PCB acts as a tracking device of the end product to which the PCB is attached.

21. The method of claim 20, further comprising the step of adding the RFID IC die and RFID antenna as first components of the PCB such that a signal received by the RFID antenna powers on the RFID circuit to receive and respond to tracking transaction requests.

22. The method of claim 21, further comprising the step of providing the RFID IC die a local memory for storage and retrieval therefrom of a plurality of tracking data that includes:
  assembly stage and date,
  test type, result and date,
  PCB serial number, and
  end product type.

23. The method of claim 22, further comprising the steps of:
  forming an RFID transponder by first performing a step selected from the group consisting of
    (1) embedding the RFID IC die in the PCB, and
    (2) attaching the RFID IC die to the PCB as an RFID IC flip chip with flip-chip technology, and
    (3) attaching a pre-packaged RFID IC die to the PCB; and
  then operably connecting the RFID circuit to the RFID antenna.

24. The method of claim 23, further comprising the steps of:
  providing the PCB with a the ground plane having a split component through all levels thereof, such that the length and shape of the split is predetermined and based on a particular grounding requirement of the end product; and
  forming the RFID split-ground-plane antenna from the split component of the PCB that behaves as a dipole antenna such that the length of the split directly determines the performance of the RFID antenna in accordance with pre-set criteria.

25. The method of claim 23, further comprising the step of forming the RFID antenna from at least one existing signal line component of the PCB operably connected to said RFID circuit to allow received energy and tracking requests to be transferred thereby to said RFID circuit and responses therefrom to the tracking requests to be transmitted thereby such that performance of the end product does not degrade when the RFID circuit is operational on the at least one signal line.

26. The method of claim 23, further comprising the steps of:
  adding at least one trace to the PCB that is operably connected to the RFID circuit; and
  forming the RFID antenna from the added at least one trace to allow received energy and tracking requests to be transferred thereby to the RFID circuit and responses therefrom to the tracking requests to be transmitted thereby.

27. The method of claim 24, further comprising the steps of:
  providing a pad layout having four I/O pad connection points at an end of the split ground plane antenna said four connection points including two RF ports on a side of the dipole antenna and where energy and tracking requests received by the antenna are transferred; and
  connecting the RFID IC flip chip at the four I/O pad connection points such that the two RF ports on said RFID circuit connect to the corresponding two RF points on a side of the antenna.

28. The method of claim 27, wherein a size of the I/O pad connection points and a distance between the I/O pad connection points is determined by the RFID circuit and varies according to a manufacturer thereof.

* * * * *